United States Patent
Low et al.

(10) Patent No.: US 6,498,578 B2
(45) Date of Patent: Dec. 24, 2002

(54) METHOD AND APPARATUS FOR GENERATING PULSES USING DYNAMIC TRANSFER FUNCTION CHARACTERISTICS

(75) Inventors: Kay Soon Low, Singapore (SG); Jurianto Joe, Singapore (SG)

(73) Assignee: The National University of Singapore (SG)

( * ) Notice: Subject to any disclaimer, the term of this patent is extended or adjusted under 35 U.S.C. 154(b) by 0 days.

(21) Appl. No.: 09/839,810

(22) Filed: Apr. 19, 2001

(65) Prior Publication Data

US 2002/0039078 A1 Apr. 4, 2002

Related U.S. Application Data

(63) Continuation-in-part of application No. 09/805,845, filed on Mar. 13, 2001, and a continuation-in-part of application No. 09/429,527, filed on Oct. 28, 1999.

(51) Int. Cl.[7] ............................. H03M 1/60; H03M 1/00
(52) U.S. Cl. ........................ 341/157; 341/133; 341/111
(58) Field of Search ........................... 341/133, 111, 341/157; 331/74; 330/284; 327/514; 318/798

(56) References Cited

U.S. PATENT DOCUMENTS

| | | | |
|---|---|---|---|
| 3,209,282 A | 9/1965 | Schnitzler | 331/107 |
| 3,239,832 A | 3/1966 | Renard | 340/347 |
| 3,246,256 A | 4/1966 | Sommers, Jr. | 331/107 |
| 3,303,350 A | 2/1967 | Neff et al. | 307/88.5 |
| 3,312,911 A | 4/1967 | De Boer | 340/347 |
| 3,387,298 A | 6/1968 | Kruy | 340/347 |
| 3,527,949 A | 9/1970 | Huth | 250/199 |
| 3,571,753 A | 3/1971 | Saunders | 331/111 |
| 3,755,696 A | 8/1973 | Nicholson et al. | 302/296 |
| 3,761,621 A | 9/1973 | Vollmeyer et al. | 178/50 |
| 3,846,717 A | 11/1974 | Fleming | 371/70 |
| 3,967,210 A | 6/1976 | Aumann | 340/825.57 |
| 4,028,562 A | 6/1977 | Zuleeg | 342/27 |
| 4,037,252 A | 7/1977 | Janssen | 340/825.54 |
| 4,365,212 A | 12/1982 | Gentile et al. | 341/143 |
| 4,425,647 A | 1/1984 | Collins et al. | 371/70 |
| 4,459,591 A | 7/1984 | Haubner et al. | 340/825.57 |
| 4,560,949 A | 12/1985 | Young | 330/284 |
| 4,599,549 A | 7/1986 | Mutoh et al. | 318/798 |
| 4,743,906 A | 5/1988 | Fullerton | 342/27 |
| 4,862,160 A | 8/1989 | Ekchian et al. | 340/825.54 |
| 5,012,244 A | 4/1991 | Wellard et al. | 341/143 |
| 5,107,264 A | 4/1992 | Novof | 341/101 |
| 5,170,274 A | 12/1992 | Kuwata et al. | 359/182 |

(List continued on next page.)

FOREIGN PATENT DOCUMENTS

| | | | |
|---|---|---|---|
| DD | 94 855 | 1/1973 | G01R/19/26 |
| DE | 2459531 A1 | 7/1976 | H03K/3/28 |
| DE | 2602794 A1 | 7/1977 | H03R/5/06 |
| DE | 19809334 A1 | 9/1999 | H03M/1/66 |
| FR | 1 438 262 | 7/1966 | H03K/5/00 |
| GB | 1036328 | 7/1966 | H03K/5/08 |
| JP | 11074766 | 3/1999 | H03R/5/06 |

OTHER PUBLICATIONS

Abell, E., "Gated Oscillator Emulates a Flip–Flop", EDN Access, pp. 1–2 Mar. 16, 1995.
Gallerani, A., "Oscillator Meets Three Requirements", EDN Access, pp. 119–120, Dec. 3, 1998.

(List continued on next page.)

*Primary Examiner*—Peguy Jean Pierre
(74) *Attorney, Agent, or Firm*—Townsend and Townsend and Crew LLP; Kenneth R. Allen

(57) ABSTRACT

A method and apparatus for generating pulses that includes a circuit having a dynamical transfer function is disclosed. The circuitry exhibits oscillatory behavior when its operating point is forced to an unstable region of the transfer function by means of manipulating the transfer function. In an embodiment, a voltage source signal is used to manipulate the transfer function of the circuit. By manipulating the transfer function, the operating points can be dynamically set in the stable or the unstable region.

40 Claims, 6 Drawing Sheets

U.S. PATENT DOCUMENTS

| | | | |
|---|---|---|---|
| 5,337,054 A | 8/1994 | Ross et al. | 342/93 |
| 5,339,053 A | 8/1994 | Lux et al. | 331/99 |
| 5,532,641 A | 7/1996 | Balasubramanian et al. | 341/143 |
| 5,764,702 A | 6/1998 | Caiaffa | 375/316 |
| 5,777,507 A | 7/1998 | Kaminishi et al. | 327/514 |
| 5,789,992 A | 8/1998 | Moon | 332/109 |
| 5,812,081 A | 9/1998 | Fullerton | 329/311 |
| 5,832,035 A | 11/1998 | Fullerton | 342/21 |
| 5,892,701 A | 4/1999 | Huang et al. | 375/210 |
| 5,901,172 A | 5/1999 | Fontana et al. | 375/326 |
| 6,023,672 A | 2/2000 | Ozawa | 364/825 |
| 6,044,113 A | 3/2000 | Oltean | 375/238 |
| 6,060,932 A | 5/2000 | Devin | 332/115 |
| 6,087,904 A | 7/2000 | Wen | 364/825 |
| 6,259,390 B1 | 7/2001 | Joe | 341/133 |
| 6,275,544 B1 | 8/2001 | Aiello et al. | 341/143 |
| 6,292,067 B1 | 9/2001 | Sasabata et al. | |

OTHER PUBLICATIONS

L. Goras et al., "On Linear Inductance– and Capacitance–Time Conversions Using NIC–Type Configuration," IEEE Tranactions on Industrial Electronics, vol. 40, No. 5 pp. 529–531 (Oct. 1993).

V. H. Jakubaschk, "das Große Elektronikbastelbuch," Deutscher Militäverlag, Leipzig, pp. 206–209 (1968).

James P. Keener, Analog Circuitry for the van der Pol and FitzHugh—Nagumo Equations, IEEE 1983, pp. 1011–1015.

U. Tietze et al., "Halbleiter–Schaltungstechnik, Fünfte, überarbeitete Auflage," Springer–Verlag, Berlin Heidelberg, New York, pp. 255–258 (1980).

Patarasen, S. et al., Maximum–Likelihood Symbol Synchronization and Detection of OPPM Sequences, IEEE Transactions on Communications, New York, US, Jun. 1994, pp. 9, vol. 42, No. 6.

Sen et al., Integration of GaAs/A1As Resonant Tunneling Diodes for Digital and Analog Applications with Reduced Circuit Complexity, Oct. 13–16, 1987.

D. Wang et al., "Image Segmentation Based on Oscillatory Correlation," Neural Computation, vol. 9, pp. 805–836 (1997).

Gang Li et al., "Performance of a Ratio–Threshold Diversity Combining Scheme in FFH/FSK Spread Spectrum Systems in Partial Band Noise Interference," Department of Electrical and Computer Engineering, and Communication Research Centre, IEEE 1992, pp. 0672–0676.

Gang Li et al., "Maximum–Likelihood Diversity Combining in Partial–Band Noise Interference Channel," Department of Electrical and Computer Engineering, and Communication Research Centre, IEEE 1993, pp. 507–511.

METHOD AND APPARATUS FOR GENERATING PULSES USING DYNAMIC TRANSFER FUNCTION CHARACTERISTICS

CROSS REFERENCE TO RELATED APPLICATIONS

This application is a continuation-in-part of U.S. application Ser. No. 09/429,527 for METHOD AND APPARATUS FOR GENERATING PULSES FROM ANALOG WAVEFORMS, filed Oct. 28, 1999 and U.S. application Ser. No. 09/805,845 for CIRCUITRY WITH RESISTIVE INPUT IMPEDANCE FOR GENERATING PULSES FROM ANALOG WAVEFORMS, filed Mar. 13, 2001, both of which are owned by the Assignee of the present invention, and are herein incorporated by reference for all purposes.

This application is related to co-pending U.S. application Ser. No. 09/429,519 for A METHOD AND APPARATUS FOR COMMUNICATION USING PULSE DECODING, filed Oct. 28, 1999 and to co-pending and co-owned U.S. application Ser. No. 09/805,854 for METHOD AND APPARATUS TO RECOVER DATA FROM PULSES, filed Mar. 13, 2001, both of which are owned by the Assignee of the present invention and are herein incorporated by reference for all purposes.

BACKGROUND OF THE INVENTION

This invention relates generally to techniques for generating pulses and more specifically to techniques for converting arbitrary analog waveforms to produce sequences of pulses.

Free running oscillations based on the relaxation oscillator approach are known. Many circuit configurations are possible. One example is a circuit comprising a tunnel diode connected in series with an inductor and a constant voltage source, to produce a periodic square waveform that has a constant frequency. U.S. Pat. No. 3,312,911 discloses a tunnel diode relaxation oscillator that produces a relaxation oscillation with the desired polarity. An op-amp based relaxation oscillator is described in U.S. Pat. No. 3,967,210. This oscillator is capable of producing oscillations in several selectable modes at different frequencies. All of these oscillators can be categorized as a free running oscillator.

The method and apparatus for a communication system disclosed in U.S. application Ser. No. 09/429,519 uses a controlled relaxation oscillator. In that application, the circuit is able to generate a number of desired oscillations followed by a substantially instant cessation of oscillatory behavior in response to an input waveform. Similarly, the circuit can also respond substantially instantly to yield a desired oscillatory behavior substantially without transients. However, the circuit disclosed in that application has reactive input impedance. The circuit is therefore frequency dependent which is not desirable under some conditions. In the U.S. application Ser. No. 09/805,845, a circuit is disclosed that has similar transfer function properties and which also possesses a resistive input impedance.

The approaches disclosed in the foregoing co-pending and co-owned application produce oscillatory behavior (i.e. generate groups of one or more pulses) when the operating point of the circuit is forced to the unstable region portion of the transfer characteristic. The oscillatory behavior ceases by forcing the operating point to a stable operating region portion of the transfer characteristic. However, the operating point of the disclosed circuits is determined solely by the input voltage. In some applications, it is desired to have the additional freedom to control the operating point via an additional input. As an example, an additional input that serves as an enable/disable control might be useful. Hence, there is a need for a circuit having transfer function characteristics that can be controlled dynamically.

SUMMARY OF THE INVENTION

In accordance with the present invention, producing pulses from analog waveforms includes providing a circuit having a transfer function characterized by having a stable operating region and an unstable operating region. The circuit is made to operate at a first operating point. The transfer function is adjusted by application of a signal to the circuit. In response, the circuit is made to operate at a second operating point. Either or both operating points can produce oscillatory behavior in the circuit. In one embodiment of the invention, the oscillatory behavior manifests itself as the production of groups of one or more pulses.

Further in accordance with the invention, producing information from an analog signal includes the foregoing to produce groups of one or more pulses. A decoding is made of the pulses to produce symbols representing the information.

BRIEF DESCRIPTION OF THE DRAWINGS

The teachings of the present invention can be readily understood by considering the following detailed description in conjunction with the accompanying drawings.

DESCRIPTION OF THE SPECIFIC EMBODIMENTS

Figure 1:
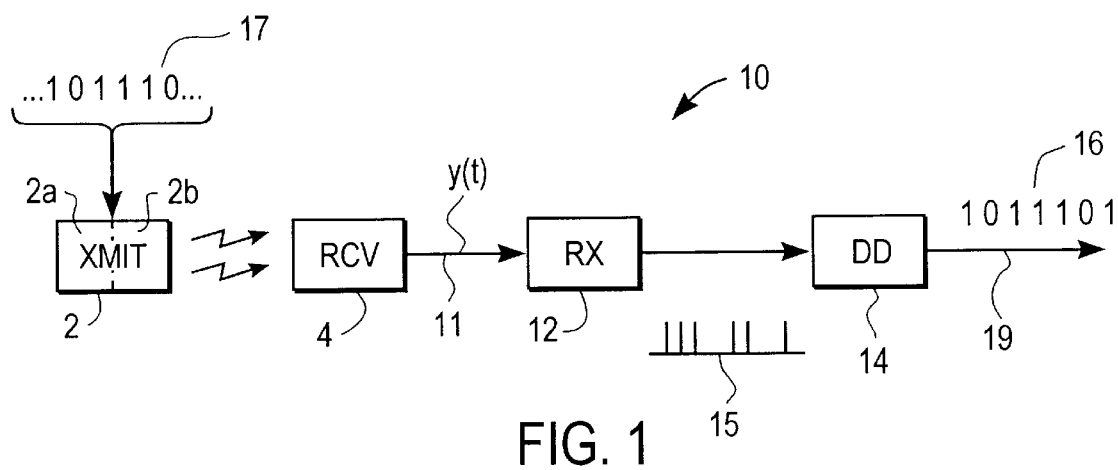
FIG. 1 shows an embodiment of the present invention as used in a communication system.

Referring to FIG. 1, a communication system 10 incorporating the present invention is shown schematically. A transmitting unit 2 receives information 17 to be transmitted. In an illustrative embodiment of the invention, a waveform generator in the transmitting unit produces a plurality of analog waveforms representative of the symbols contained in the information. In accordance with the invention, each symbol has a corresponding waveform. The transmitting unit produces an analog waveform signal comprising individual analog waveforms representative of the individual symbols in the information. The analog waveform signal is transmitted to a receiver unit 4 over an appropriate transmission medium. The receiver unit produces the analog waveform signal as a received signal y(t).

The received signal y(t) is applied to an input 11, which feeds a receiver 12. As will be explained below, the receiver is configured to respond to the received signal by producing oscillatory output 15. The output of the receiver feeds into a decision device 14. The decision device produces a character (symbol) selected from an alphabet (e.g. an alphabet might comprises the 3-bit characters "000", "001","010", "011","100", "101", "110", and "111") as a function of the oscillatory outputs feeding into it. An output 19 of the decision device outputs the character. For example, in an illustrative embodiment of the invention, the decision device 14 simply counts the number of pulses in each group of pulses. Thus, for example, a pulse count of 1 can by definition represent the 3-bit character "000", a pulse count of 2 maps to the 3-bit character "001", and so on. Pulse counting circuits are known, and so no further discussion of such circuits is needed. Additional implementations for the decision device can be found in U.S. application Ser. No. 09/805,854. The specific implementation will depend on factors such as cost, performance, system complexity, circuit complexity, and so on; considerations which are not relevant to the practice of the present invention.

In another illustrated embodiment, the transmitter unit 2 comprises a waveform generating portion 2A to produce the foregoing analog waveform signal, and a modulation circuit 2B. In this particular embodiment, assume the analog waveform signal in and of itself is not appropriate for transmission. For example, if the communication system is a conventional radio transmission system then the analog waveform signal may have to be modulated onto a carrier signal as a practical matter. In such a case the modulation circuit might be a conventional radio modulation circuit. Accordingly, the receiver unit 4 might include a demodulation circuit to produce the analog waveform signal as received signal y(t).

In a simple embodiment of the invention, the communication from transmitter unit 2 to receiver unit 4 may be as simple as sending the analog waveform signal over a wire or wireless channel. In such a case, the receiver unit may simply be some sort of filter and amplifier circuit. A more sophisticated embodiment may require that the analog waveform signal be modulated in a suitable way to accommodate the transmission medium, and consequently demodulated. The method of transmission of the analog waveform signal is not relevant to the practice of the invention (e.g., whether modulation is required or not, and so forth). Any of a number of known transmission techniques can be used.

In one embodiment of the invention, the creation of the analog waveform signal occurs in a piecewise fashion. First, a set of symbols comprising the information is defined. This might be the binary code of "1" and "0". The symbol set might be an alphabet of two-bit binary characters, namely, "00", "01", "10", and "11". The symbol might be the alphabet of the English language, "a"–"z", and so on. For each symbol (character) at least one analog waveform is associated with it.

Next, information 17 (FIG. 1) is received. For each symbol, the waveform generating portion 2A of the transmitter unit 2 produces corresponding analog waveform. The analog waveforms might be digitized and the waveform generating portion might be a digital signal processor (DSP) which simply performs a table lookup to produce the analog waveform. Other conventional techniques are readily adapted to perform this function. The analog waveforms are combined to produce an analog waveform signal which constitutes the information 17 to be transmitted. In one embodiment of the invention, the individual analog waveforms associated with each symbol are ready for radio transmission.

Figure 2A:
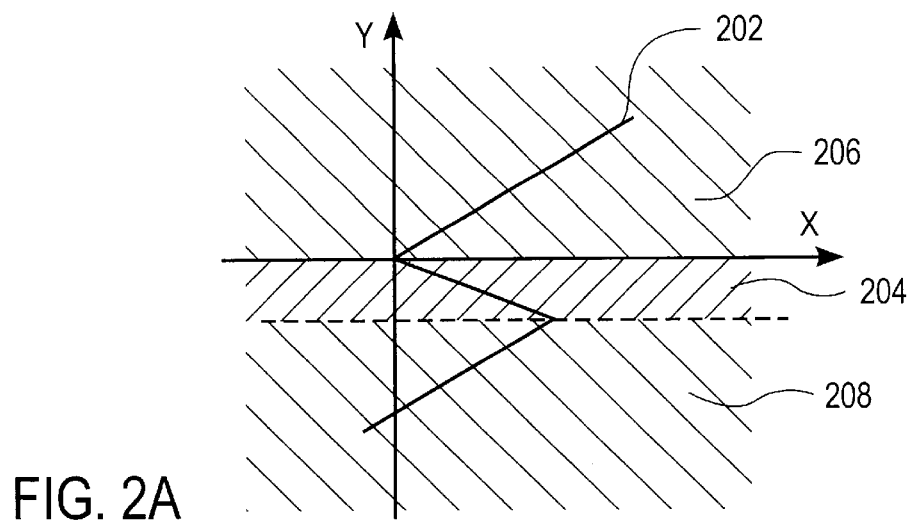
FIGS. 2A and 2B illustrate the two types of transfer functions which characterize the circuitry of the present invention.
Figure 2B:
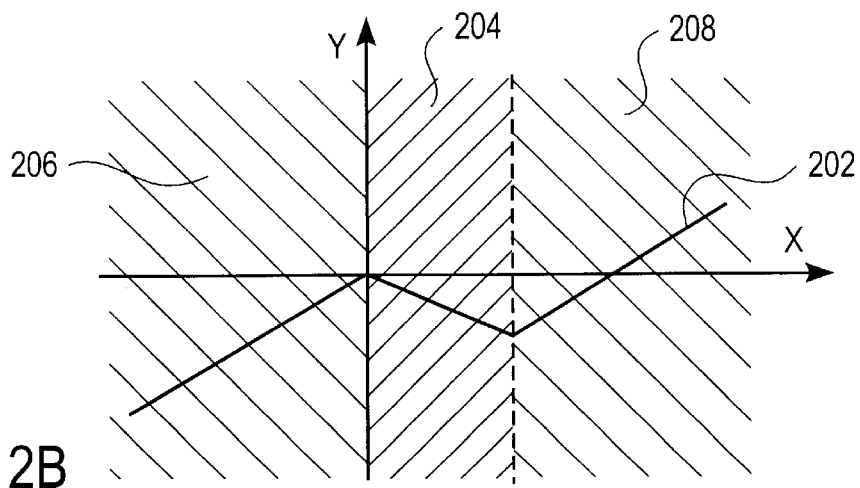

Referring to FIGS. 2A and 2B for a moment, the illustrative circuits disclosed in the present invention exhibit a transfer function having either an S-shaped appearance such as shown in FIG. 2A or the N-shaped appearance shown in FIG. 2B. For the purposes of the present invention, the "transfer function" of a circuit refers to the relationship between any two state variables of a circuit. Electronic circuits are typically characterized by their I-V curves, relating the two state variables of current and voltage. Such curves indicate how one state variable (e.g., current) changes as the other state variable (voltage) varies. As can be seen in FIGS. 2A and 2B, each transfer function 202 includes a portion which lies within a region 204, referred to herein as an "unstable" region. The unstable region is bounded on either side by regions 206 and 208, each of which is herein referred to as the "stable" region.

A circuit in accordance with the invention has an associated "operating point" which is defined as its location on the transfer function 202. The nature of the output of the circuit depends on the location of its operating point. If the operating point is positioned along the portion of the transfer function that lies within region 204, the output of the circuit will exhibit an oscillatory behavior. Hence, the region 204 in which this portion of the transfer function is found is referred to as an unstable region. If the operating point is positioned along the portions of the transfer function that lie within either of regions 206 and 208, the output of the circuit will exhibit a generally time-varying but otherwise non-oscillatory behavior. For this reason, regions 206 and 208 are referred to as stable regions.

Such behavior is referred to as a "controlled" relaxation oscillation. In the context of the present invention, the term "controlled relaxation oscillations" refers to the operation of circuitry in such a way that a number of desired oscillations can be generated followed by a substantially instantaneous termination of the oscillations. Conversely, the circuit is able to respond, substantially without transients, from a non-oscillatory condition to an oscillatory state to yield a desired number of oscillations.

U.S. application Ser. No. 09/429,527 disclose circuits for achieving controlled relaxation oscillations. U.S. application Ser. No. 09/805,824 discloses circuitry also having controlled relaxation oscillations, but further being characterized by having resistive input impedances.

Figure 3:
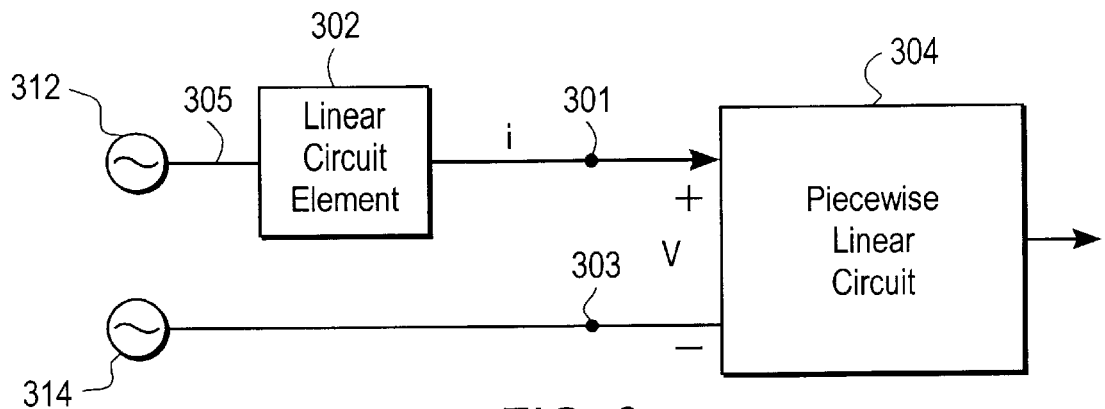
FIG. 3 shows a high level block diagram of the circuitry of the invention.

FIG. 3 shows a high level block diagram of a circuit according to the present invention. The circuit is a controlled relaxation oscillator which has a translatable transfer function characteristic. An input voltage source 312 coupled to an input signal node 305 drives the circuit. The circuit comprises a linear circuit element 302 coupled in series fashion to an input node 301 of a piecewise linear circuit 304. A second voltage source 314 is coupled to a second input node 303 of the piecewise linear circuit. As will be explained, the second voltage source serves to translate the transfer function of the piecewise linear circuit.

The transfer function of the piecewise linear circuit 304 is characterized by having stable and unstable operating regions as discussed above in connection with FIGS. 2A and 2B. The circuit has at least one unstable operating region bounded by a first stable operating region and a second stable operating region.

Figure 4:
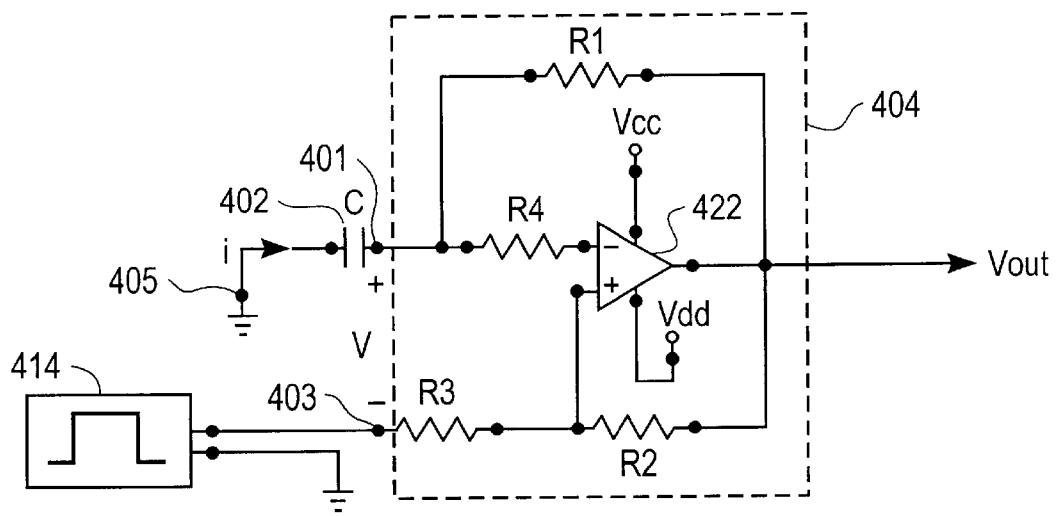
FIG. 4 illustrates an embodiment of a circuit according to the invention.

Referring now to FIG. 4, an illustrative embodiment of the circuit depicted in FIG. 3 is shown. The circuit 404 is a piecewise linear circuit built around an op-amp 422. The op-amp can be a voltage feedback type or a current feedback type. Merely as an example, the embodiment illustrated in the figure shows the use of a current feedback type op-amp EL2186. A negative feedback path is provided by resistive element R1. A resistor element R4 is coupled between a first input of the circuit at signal input node 401 and the negative input to the op-amp. A resistive element R2 is coupled between the op-amp output and its positive input. A resistive element R3 is coupled between the positive input of op-amp 422 and a second input node 403, which serves as a second input to the circuit.

A capacitor 402 serves as the linear element 302 shown in FIG. 3. The capacitor is series coupled between node 401 and an input signal node 405. A signal generator 414 provides a signal to the second input by connection to node 403.

For the following explanation, consider the simple case where the input source 312 (FIG. 3) is set to zero; that is, the signal input node 405 is tied to ground. The transfer function of the circuit 404 is similar to the diagram shown in FIG. 2A. By properly biasing the op-amp 422 through the pins Vcc and Vdd, and providing a selection of a suitable set of passive components (R1, R2, R3, R4 and C), the desired transfer function characteristics can be attained. Thus, for the illustrative embodiment of FIG. 4, the biasing voltages for the Vcc and Vdd can be set to 3 V and −0.8 V respectively, as an example. The resistors and capacitor values are: R1=680Ω, R2=68Ω, R3=100Ω, R4=110Ω, and C=50 pF.

Figure 5:
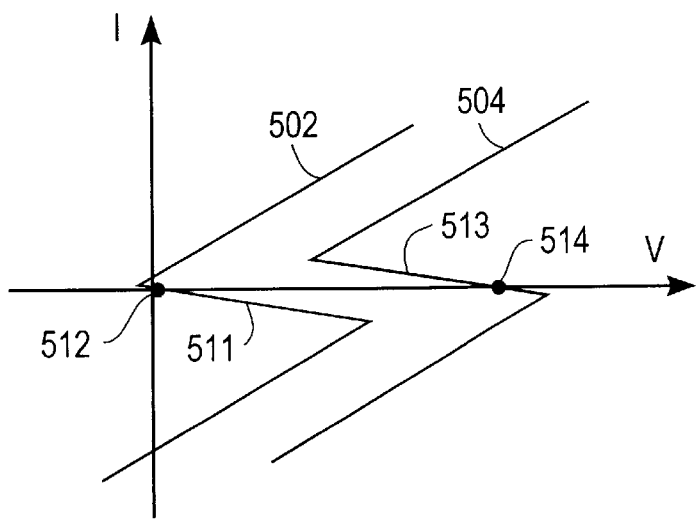
FIG. 5 shows the behavior of the transfer function of the circuit of FIG. 4 according to the invention.

Referring to FIGS. 4 and 5, let the waveform function of the signal generator 414 be denoted by $f(t)$. The voltage of the S-shaped transfer function can be described using the relationship of V and i as $V=\psi(i,f(t))$. For the case that the voltage waveform of signal generator 414 is a square waveform, the function $f(t)$ has two voltage levels $V_1$ and $V_2$, where $V_1<V_2$. When the output of the signal generator 414 is $V_1$, the transfer function characteristic of the circuit 404 is described by the curve 502 shown in FIG. 5. When the output of the signal generator becomes $V_2$, the transfer function characteristic of the circuit is shown by curve 504.

The equations relating the voltage V and the current i are:

$$\frac{dV}{dt} = \frac{dV_{in}}{dt} - \frac{i}{C}, \text{ and} \quad (1)$$

$$\lim_{L \to 0} L\frac{di}{dt} = V - \psi(i, f(t)), \quad (2)$$

where $V_{in}$ is the input voltage of the source 312 (FIG. 3), which is set to zero in this case. L is a parasitic inductance which could be present in the form of a wire lead of the electronic components.

The operating points of the circuit can be obtained by setting dV/dt=0 in Eqn. 1 and di/dt=0 in Eqn. 2. With di/dt=0, the voltage $V=\psi(i,f(t))$. Hence, the operating point is the intersection of i=0 and the piecewise linear function of the transfer function. The operating points change by virtue of translating the S-shaped characteristic curve.

For the example shown in FIG. 5, the operating point is located at point 512 on the transfer curve, when the signal generator 414 outputs $V_1$. Similarly, the operating point is located at point 514 on the transfer curve, when the signal generator outputs V2 translates the transfer function. In this particular situation, both operating points lie on the unstable region portions 511, 513 of the transfer characteristic. Consequently, the circuit will always exhibit oscillatory behavior. Due to the fact that the two operating points occur at different locations of their respective characteristic curve, the frequencies of oscillations will be different.

Figure 6A:
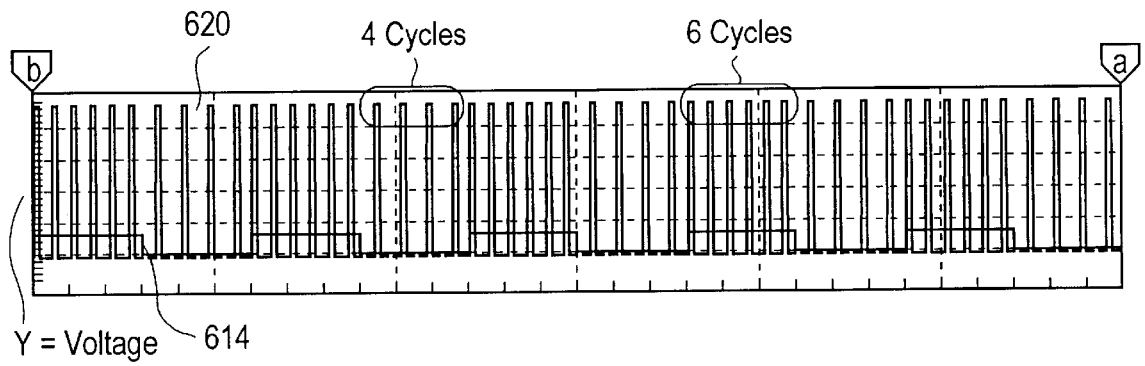
FIGS. 6A and 6B show results using the circuit of FIG. 4.

FIG. 6A illustrates an example of a typical response for circuit 404 shown in FIG. 4 where the input node 405 is tied to ground. Since the input is coupled to the circuit 404 through a capacitor 402, we may also connect a DC voltage source to the input node 405 and achieve the similar result. The second input node is coupled to the square wave generator 414 as shown. The input waveform 614 represents the square wave produced by the square wave generator. The output signal appearing at the output $V_{out}$ of the circuit is represented by output waveform 620.

The response of FIG. 6A is explained with reference to the circuit configuration 404 shown in FIG. 4 and to the graph illustrated in FIG. 5. When the input waveform 614 of the square wave generator 414 outputs a voltage level $V_1$ volts, the circuit outputs four cycles of oscillations during that time by virtue of the operating point being located at a first position—say for example at position 512—on the transfer function. When the input waveform is at V2, the transfer function is translated so that the operating point now is at a second position—say for example at position 514—on the transfer function. Consequently, the circuit outputs six cycles of oscillations during the time that the square wave is at V2 volts.

Figure 6B:
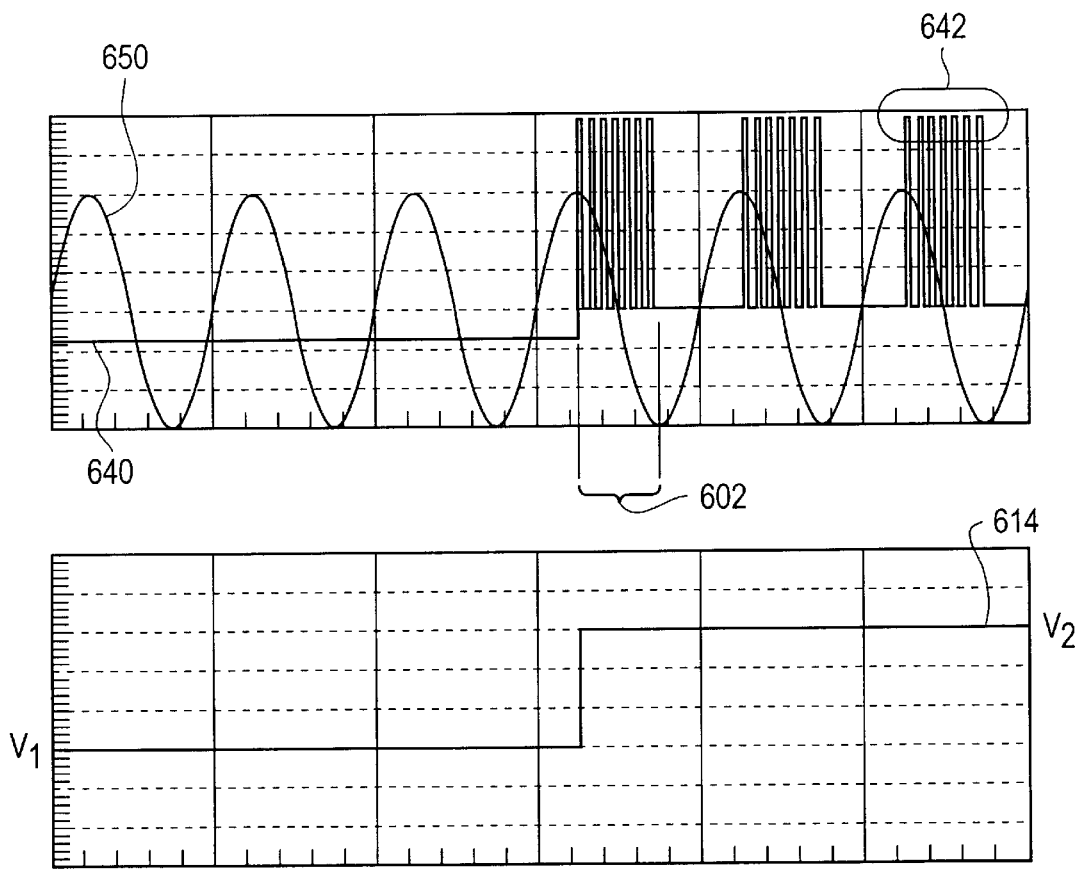

FIG. 6B illustrates another example of circuit operation of the circuit of FIG. 4. In this example, the signal input node 405 is coupled to a sinusoidal waveform source. This signal is shown in FIG. 6B as the waveform 650. A step waveform is used for the signal generator 414 that is connected to input node 403 as shown in FIG. 6B by waveform 614.

As can be seen, the waveform generator 414 serves as an enable/disable control input to the circuit 404. When the amplitude of the input waveform is $V_1$, then the circuit output is disabled. The circuit produces no pulses and maintains a substantially constant output voltage at its output $V_{out}$, shown in FIG. 6B by waveform 640. When the amplitude of the input waveform is V2, the circuit is enabled.

Figure 6C:
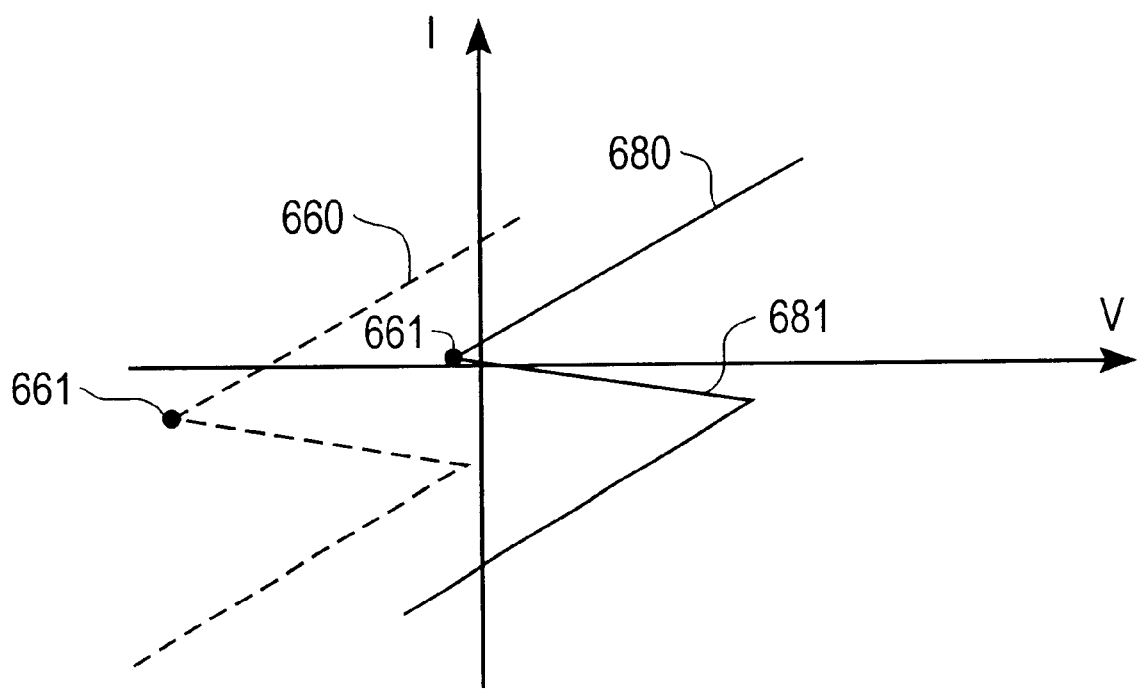
FIG. 6C shows the behavior of the transfer function of the circuit of FIG. 4 according to the invention.

The enable and disable operations can be explained using the transfer curves shown in FIG. 6C. At V1, which is set to a negative voltage, say −3 V, the transfer curve is shown by the graph 660. Since there is a sinusoidal source 650 coupled to the input node 405, the operating point is the intersection of the line $CdV_{in}/dt$ and the curve 660. In this illustrative example, the operating point is always located in the stable region of the curve, i.e. above the impasse point 661. Consequently, there are no pulses generated. With V2 set to a more positive voltage, the transfer curve is being dynamically moved to the right and upwards. In this illustrative example, V2 is set to zero. We observe from FIG. 6C that the new transfer curve becomes 680. Since the new operating point is now located in the unstable region 681 (i.e., below the impasse point 661), whenever the signal 650 has a negative slope, we observe that pulses are generated.

When the circuit 404 is enabled, it responds to the input signal applied to the input signal node 405. The circuit responds to the input signal by forcing its operating point to an unstable region of its transfer characteristic or to a stable region of its transfer characteristic. As can be seen in FIG. 6B, the circuit 404 is configured to produce groups of pulses during a negative-going slope portion 602 of the input signal 650.

Figure 7A:
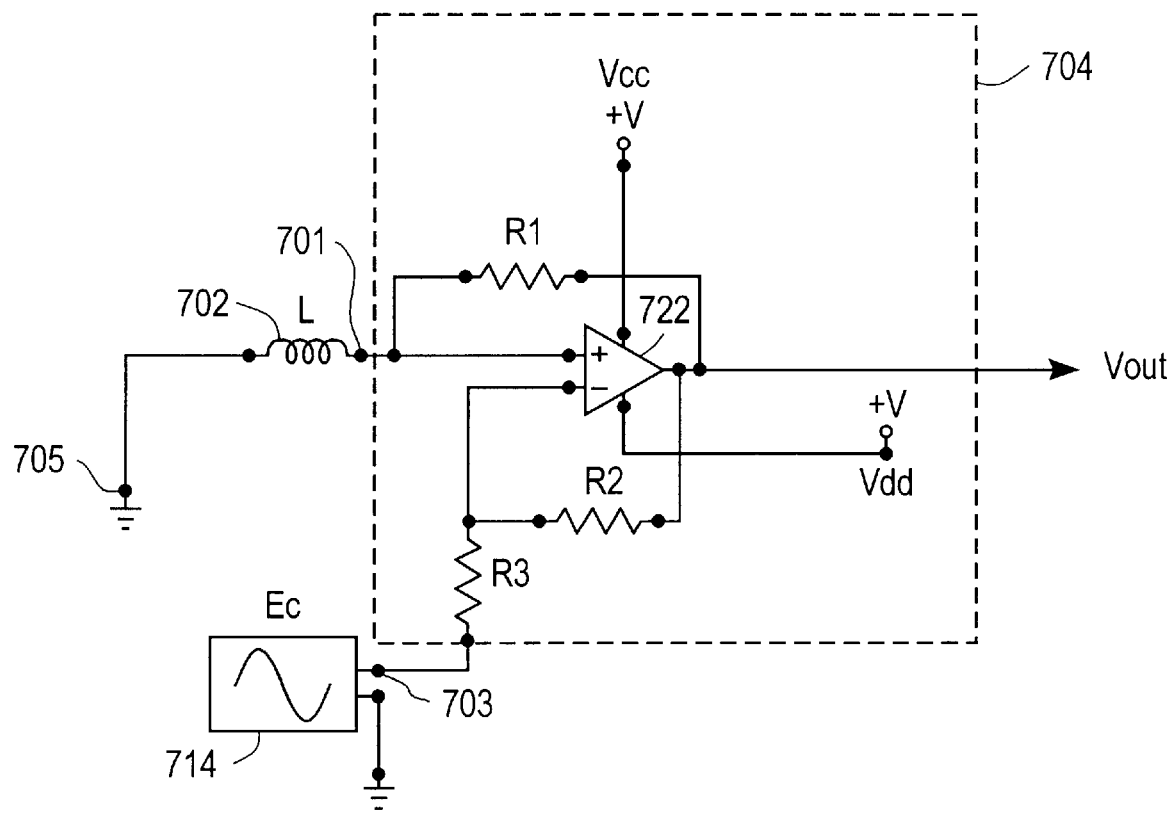
FIG. 7A illustrates another embodiment of a circuit according to the invention.

Referring now to FIG. 7A, an illustrative circuit of another embodiment of the present invention schematically shown in FIG. 3. This illustrative circuit 704 is characterized by the transfer function shown in FIG. 2B. In this example configuration, the linear circuit element 302 shown in FIG. 3 is an inductor 702. The inductor is series-coupled between signal input node 705 and circuit input node 701. The signal input node 705 is coupled to ground in this illustrative example. A voltage waveform source 714 is coupled to a second circuit input node 703.

The circuit 704 comprises an op-amp component 722. A positive feedback is provided by resistive element R1. A second resistive element R2 is coupled between the op-amp output $V_{out}$ and its negative input. A third resistive element R3 is coupled between the circuit input node 703 and the negative input.

The circuit 704 can obtain the transfer function shown in FIG. 2B by properly biasing the op-amp 722 through the pins Vcc and Vdd, and by the selection of a suitable set of passive components (R1, R2, R3 and L). The op-amp can be the voltage feedback type or the current feedback type. In the illustrative circuit shown, current feedback type op-amp EL2186 is used. The biasing voltages for the Vcc and Vdd might be set to 5 V and 0V, respectively, as an example. For the particular illustrated example of the circuit shown, the resistors and inductor values are: R1=1000Ω, R2=68Ω, R3=100Ω, L=10mH.

Recall that the input signal node 705 is a ground. The operating point of the circuit 704 is therefore located on the intersection of V=0 and the piecewise linear function of the transfer function of the circuit. Consider the case that the voltage source 714 is a 5 KHz sinusoidal waveform. The N-shaped transfer function characteristic curve will translate in response to the changing waveform of the voltage source.

Figure 7B:
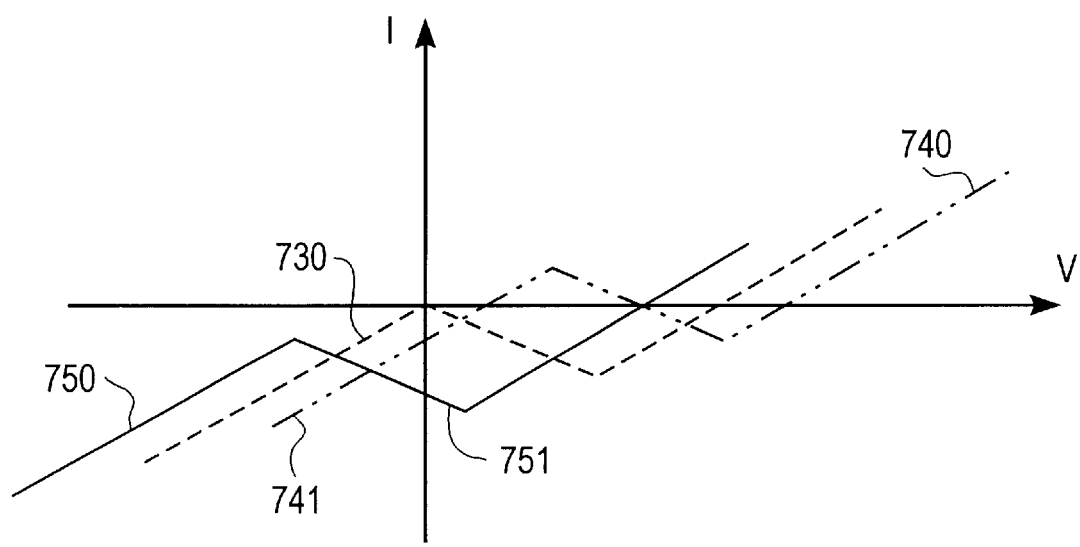
FIG. 7B shows the behavior of the transfer function of the circuit of FIG. 7A according to the invention.

Thus, referring to FIG. 7B, when the waveform from generator 714 is 0V, the transfer function curve is represented by the curve 730. As the waveform becomes positive, the curve will be translated to the right and upwards to a maximum position when the sinusoid is at its positive peak value. At some instant in time during the sinusoid's transition from 0V to its peak positive value, the transfer function curve will traverse from its zero position to a maximum positive displacement indicated by curve 740.

Thus, as the transfer function curve is displaced in the direction from its zero position at 730 to its maximum positive displacement position at 740, it can be seen that the V=0 line intersects the transfer function curve in a stable portion 741 of the curve. Thus, the operating point of the circuit during this part of the sinusoidal waveform is located in a stable region of operation for the circuit. Consequently, the output signal $V_{out}$ of the circuit is substantially a constant voltage condition.

When the sinusoidal signal from the generator 714 swings below 0V toward its negative peak value, the transfer function curve will be translated in the direction from its zero position 730 to a minimum negative displacement as shown by curve 750. In this case, it can be seen that the V=0 line intersect the transfer function curve in an unstable portion 751 of the curve. Thus, the operating point of the circuit 704 during this part of the sinusoidal waveform is located in the unstable region of operation for the circuit. Consequently, the output signal $V_{out}$ of the circuit will be oscillatory.

Figure 8:
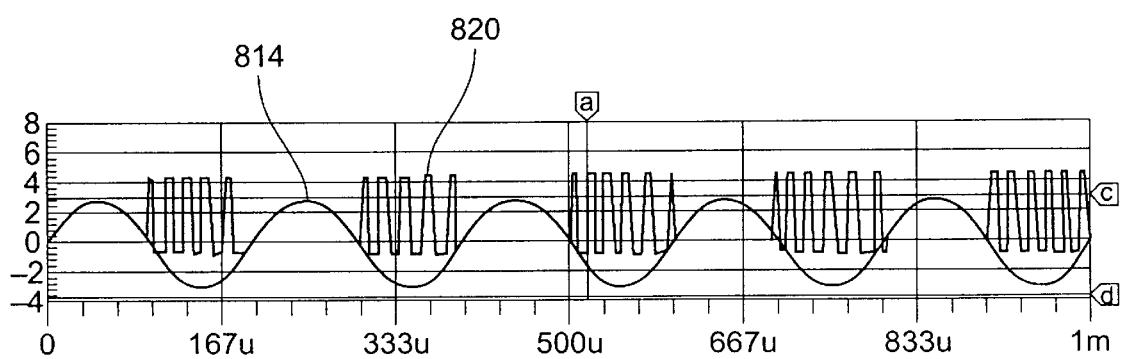
FIG. 8 shows results using the circuit of FIG. 7A.

FIG. 8 illustrates experimental results of the circuit 704. The waveform 814 is the sinusoidal signal applied to the circuit from input source 714. The waveform 820 is the output waveform observed at the circuit $V_{out}$. It can be observed from the figure that whenever the input waveform 814 is negative, the circuit produces oscillations.

The sinusoidal and square wave signals were selected merely to facilitate the discussion on the invention in connection with the illustrative embodiments. It can be appreciated from the foregoing that other signals may be used to produce groups of pulses. They include time-varying signals, signals having periodicity, constant voltage signals, continuous or discontinuous, and so on. The present invention is not constrained by the use of any particular form of signal. For example, in one embodiment of the invention, the circuitry of the invention is used in a communication system. There, an appropriate signal form to be used is a time varying, continuous signal such as a sine wave or the like, for the reason that such signals are appropriate for conventional modulation and demodulation techniques. Thus, the particular application at hand will dictate appropriate signal forms.

This invention has been explained with reference to specific illustrative embodiments. Various circuits having resistive input impedances, for generating pulses from analog waveforms have been presented. Resistive input impedance is easily matched to other circuits because it is independent of frequency. Hence, broadband matching is not an issue. Based on the teachings of the foregoing disclosure, other embodiments in accordance with the invention will be evident to those of ordinary skill in the art. It is therefore not intended that this invention be limited except as indicated by the appended claims.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Although the present invention has been described in terms of specific embodiments, it should be apparent to those skilled in the art that the scope of the present invention is not limited to the described specific embodiments.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for producing pulses in a circuit characterized by a transfer function having an unstable region and a stable region, said circuit having an operating point, the method comprising:
    forcing said operating point to a first point on said transfer function; and
    translating said transfer function so that said operating point is at a second point on said transfer function,
    said first point on said transfer function being within a first region of said unstable region so that said circuit produces first pulses.

2. The method of claim 1 wherein said second point on said transfer function is within said stable region so that said circuit ceases production of said first pulses.

3. The method of claim 1 wherein said second point on said transfer function is within a second region of said unstable region so that said circuit produces second pulses different from said first pulses.

4. The method of claim 1 wherein said forcing includes applying a constant voltage level to said circuit.

5. The method of claim 1 wherein said constant voltage level is ground potential.

6. The method of claim 1 wherein said forcing includes applying a time varying signal to said circuit.

7. The method of claim 6 wherein said time varying signal is sinusoidal.

8. The method of claim 1 wherein said translating includes applying a time varying signal to said circuit.

9. The method of claim 8 wherein said time varying signal is a square wave.

10. The method of claim 1 wherein said pulses are groups of pulses.

11. A method for generating pulses comprising:
    providing a circuit having a transfer function comprising a first unstable operating region bounded by a first and a second stable operating region, said circuit having an operating point, said circuit having first and second inputs;
    applying a first voltage potential to said circuit to force said operating point to a first position on said transfer function; and translating said transfer function by applying a second voltage to said circuit so that said operating point is at a second position on said transfer function, wherein said operating point is forced said unstable region and one of said stable regions in response to translation of said transfer function, wherein said circuit produces one or more groups of pulses when said operating point is in said unstable region.

12. The method of claim 11 wherein said first voltage potential is a constant voltage level.

13. The method of claim 12 wherein said constant voltage level is ground potential.

14. The method of claim 11 wherein said first voltage potential is a time varying signal.

15. The method of claim 11 wherein said first voltage potential is one cycle of a periodic time varying signal.

16. The method of claim 11 wherein said first voltage potential is a sinusoidal signal.

17. The method of claim 11 wherein said second voltage is a time varying signal.

18. The method of claim 17 wherein said time varying signal is a square wave.

19. A method for generating pulses comprising:

receiving a first analog waveform;

applying said first analog waveform to a first input of a circuit, said circuit characterized by a transfer function having at least one unstable operating region bounded by two stable operating regions;

in response to said first analog waveform, forcing an operating point of said circuit to a first portion of said unstable region to produce first pulses;

receiving a second analog waveform;

applying said second analog waveform to a second input of said circuit, said transfer function being translated in response to said second analog waveform; and in response to translation of said transfer function, said operating point being forced to a second portion of said unstable region to produce second pulses.

20. The method of claim 19 wherein said first analog waveform is a constant voltage level.

21. The method of claim 19 wherein said first and second analog waveforms are time varying signals.

22. The method of claim 21 wherein said first analog waveform further is one cycle of a periodic time varying signal.

23. The method of claim 20 wherein said constant voltage level is ground potential.

24. The method of claim 19 wherein said first analog waveform is sinusoidal.

25. The method of claim 19 wherein said second analog waveform is a square wave.

26. A method for producing information from analog waveforms comprising:

providing a circuit characterized by having a stable operating region and an unstable operating region;

applying a first analog waveform to a first input of said circuit, and in response thereto forcing said circuit to operate in said unstable operating region to produce oscillations;

producing at least a first symbol based on said oscillations; and applying a second analog waveform to a second input of said circuit to translate said stable and unstable operating regions in such a way as to place said operating point in said stable operating region to terminate production of said oscillations.

27. The method according to claim 26 wherein said oscillations are groups of one or more pulses.

28. The method according to claim 26 wherein said first and second analog waveforms are time varying signals.

29. The method according to claim 26 wherein said first and second analog waveforms each is one cycle of a periodic time varying signal.

30. The method according to claim 26 wherein said first and second analog waveforms each is a sinusoidal signal.

31. The method according to claim 26 wherein said first and second analog waveforms are constant voltage signals.

32. A device for producing pulses comprising;

a circuit having an unstable operating region and a stable operating region;

a first input for receiving a first signal and for applying said first signal to said circuit;

a second input for receiving a second signal and for applying said second signal to said circuit; and an output coupled to said circuit, said circuit responsive to sensing said first signal to operate in one of said stable and unstable operating regions, wherein operation in said unstable operating region produces oscillations at said output, said circuit further responsive to sensing said second signal to translate said stable and said unstable operating regions so that said circuit is no longer responsive to said first signal, thereby ceasing production of said oscillations.

33. The device according to claim 32 wherein said circuit is responsive to amplitudes of said first and second signals.

34. The device according to claim 32 wherein said circuit is responsive to slopes of said first signal.

35. The device according to claim 32 wherein said circuit is responsive to one cycle of said first signal.

36. A device for producing information from analog waveforms, comprising;

a circuit having transfer curve characterized by an unstable region and a stable region, said circuit having a first input terminal for receiving said analog waveforms, said circuit having an output terminal, said circuit having a second input terminal; and a decoder coupled to said output terminal, said circuit configured to operate in said unstable region in response to receiving said analog waveform to produce a first oscillatory output signal at said output terminal, said decoder, in response to detecting said first oscillatory output signal, producing a first symbol, said circuit having a translated transfer curve in response to receiving a second analog waveform applied to said second input, thereby producing a second output signal at said output terminal.

37. The device according to claim 36 wherein said second signal is an oscillatory signal different from said first oscillatory signal.

38. The device according to claim 36 wherein said second signal is a constant voltage level.

39. The device according to claim 36 wherein said circuit is sensitive to amplitudes of said analog waveforms.

40. The device according to claim 36 wherein said circuit is sensitive to slopes of said analog waveforms.

* * * * *